(12) United States Patent
Avery et al.

(10) Patent No.: US 6,633,244 B2
(45) Date of Patent: Oct. 14, 2003

(54) EFFICIENT AND LOSSLESS CONVERSION FOR TRANSMISSION OR STORAGE OF DATA

(75) Inventors: Caleb Avery, Steamboat Springs, CO (US); Ralph Tobelmann, Steamboat Springs, CO (US)

(73) Assignee: Efeckta Technologies Corporation, Steamboat Springs, CO (US)

( * ) Notice: Subject to any disclaimer, the term of this patent is extended or adjusted under 35 U.S.C. 154(b) by 0 days.

(21) Appl. No.: 09/753,059

(22) Filed: Dec. 29, 2000

(65) Prior Publication Data

US 2001/0038347 A1 Nov. 8, 2001

Related U.S. Application Data

(60) Provisional application No. 60/174,305, filed on Jan. 3, 2000.

(51) Int. Cl.[7] .......................... H03M 7/00; H03M 7/34; H03M 7/38
(52) U.S. Cl. ............................................. 341/60; 341/51
(58) Field of Search ............................. 341/51, 60, 50, 341/95, 80; 382/248, 169; 707/102, 2; 375/240.01, 240.24, 240.11; 386/46, 33; 348/231.6, 391.1

(56) References Cited

U.S. PATENT DOCUMENTS

| | | | |
|---|---|---|---|
| 4,290,051 A | | 9/1981 | Stakhov et al. |
| 5,087,913 A | | 2/1992 | Eastman |
| 5,101,446 A | | 3/1992 | Resnikoff et al. |
| 5,153,591 A | | 10/1992 | Clark |
| 5,257,097 A | * | 10/1993 | Pineau et al. ................ 358/500 |
| 5,329,279 A | | 7/1994 | Barbu et al. |
| 5,379,036 A | * | 1/1995 | Storer .......................... 341/51 |
| 5,495,244 A | | 2/1996 | Jeong et al. |
| 5,592,667 A | | 1/1997 | Bugajski |
| 5,708,729 A | | 1/1998 | Adams et al. |
| 5,822,458 A | * | 10/1998 | Silverstein et al. .......... 382/235 |
| 5,852,742 A | * | 12/1998 | Vondran et al. ................ 712/28 |
| 6,167,083 A | * | 12/2000 | Sporer et al. ........... 375/240.01 |
| 6,167,392 A | | 12/2000 | Ostrovsky et al. |

FOREIGN PATENT DOCUMENTS

| | | |
|---|---|---|
| EP | 0 737 939 A3 | 10/1996 |
| EP | 0 949 589 A2 | 10/1999 |

\* cited by examiner

*Primary Examiner*—Patrick Wamsley
(74) *Attorney, Agent, or Firm*—Fenwick & West LLP

(57) ABSTRACT

A system and method for lossless data compression. A mathematical transform equivalent to the content value of the data, and taking fewer bits to represent, is found.

60 Claims, 8 Drawing Sheets

EFFICIENT AND LOSSLESS CONVERSION FOR TRANSMISSION OR STORAGE OF DATA

This application claims priority under 35 U.S.C. §119(e) from U.S. patent application Ser. No. 60/174,305, filed Jan. 3, 2000, which is incorporated by reference in its entirety.

BACKGROUND

1. Field of the Invention

This invention relates to data transformation, more particularly, to lossless data compression.

2. Background of the Invention

Existing compression technology focuses on finding and removing redundancy in the input binary data. Early compression approaches focused on the format of the data. These format approaches utilize run-length encoding (RLE) and variations of frequency mapping methods. These pattern-coding approaches work well for ASCII character data, but never reached the compression potential for other data formats.

Advances in compression technology evolved from information theory, particularly Claude Shannon's work on information entropy. The bulk of this work is statistical in nature. Shannon-Fano and Huffman encoding build probability trees of symbols in descending order of their occurrence in the source data, allowing the generation of "good" variable-size codes. This is often referred to as entropy coding. Compression is accomplished because more frequently occurring binary patterns are assigned shorter codes, allowing for a reduction in the overall average of bits required for a message.

Shannon-Fano and Huffman encoding are optimal only when the probability of a pattern's occurrence is a negative power of 2. These methods engendered a number of adaptive versions that optimize the probability trees as the data varies.

Arithmetic Coding overcame the negative power of 2 probabilities problem by assigning one (normally long) code to the entire data. This method reads the data, symbol by symbol, and appends bits to the output code each time more patterns are recognized.

The need for more efficiency in text encoding led to the development and evolution of dictionary encoding, typified by LZ family of algorithms developed by J. Ziv and A. Lempel. These methods spawned numerous variations. In these methods, strings of symbols (a dictionary) are built up as they are encountered, and then coded as tokens. Output is then a mix of an index and raw data.

As with entropy coding, dictionary methods can be static, or adaptive. Variants of the LZ family make use of different techniques to optimize the dictionary and its index. These techniques include: search buffers, look-ahead buffers, history buffers, sliding windows, hash tables, pointers, and circular queues. These techniques serve to reduce the bloat of seldom-used dictionary entries. The popularity of these methods is due to their simplicity, speed, reasonable compression rates, and low memory requirements.

Different types of information tend to create specific binary patterns. Redundancy or entropy compression methods are directly dependent upon symbolic data, and the inherent patterns that can be recognized, mapped, and reduced. As a result, different methods must be optimized for different types of information. The compression is as efficient as the method of modeling the underlying data. However, there are limits to the structures that can be mapped and reduced.

The redundancy-based methodologies are limited in application and/or performance. In general, entropy coding either compromises speed or compression when addressing the limited redundancy that can be efficiently removed. Typically, these methods have very low compression gain. The primary advantage is that entropy coding can be implemented to remain lossless.

Lossy compression can often be applied to diffuse data such as data representing speech, audio, image, and video. Lossy compression implies that the data cannot be reconstructed exactly. Certain applications can afford to lose data during compression and reconstitution because of the limitations of human auditory and visual systems in interpreting the information. Perceptual coding techniques are used to exploit these limitations of the human eyes and ears. A perceptual coding model followed by entropy encoding, which uses one of the previously discussed techniques, produces effective compression. However, a unique model (and entropy coder) is needed for each type of data because the requirements are so different. Further, the lossy nature of such compression techniques mean the results lose some fidelity, at times noticable, from the original, and make them unsuitable for many purposes.

Thus, a method for compression that is both lossless and capable of high compression gain is needed.

SUMMARY OF THE INVENTION

The present invention compresses binary data. The data is split into segments. Each of these segments has a numerical value. A transform, along with state information for that transform, is selected for each segment. The numerical value of the transform with its state information is equal to the numerical value of the segment. The transform, state information and packet overhead are packaged into a transform packet. The bit-length of the transform packet is compared to the bit-length of a segment packet that includes the raw segment and any necessary packet overhead. The packet with the smaller bit-length is chosen and stored or transmitted. After reception of the packets, or retrieval of the packets from storage, the numerical value of each segment is recalculated from the transform and state information, if necessary. The segments are recombined to reconstitute the original binary data.

DETAILED DESCRIPTION OF THE PREFERRED EMBODIMENTS

Figure 1:
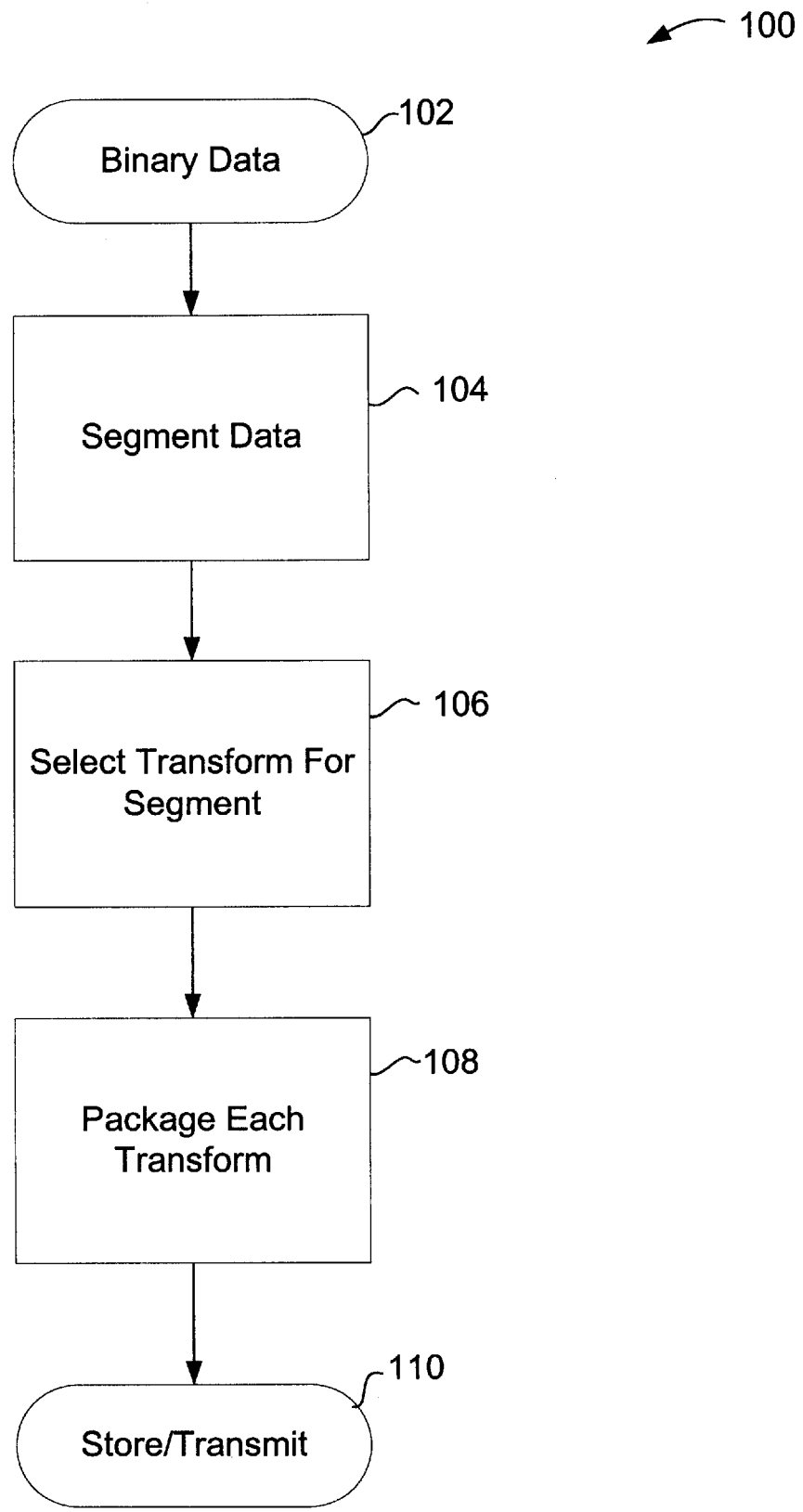
FIG. 1 is a flow chart showing an overview of the compression process.

FIG. 1 is a flow chart showing an overview of the compression process 100. The initial input 102 is binary data. Any piece of binary data is simply a number expressed in binary form. Thus, any piece of binary data has a numerical value. This numerical value is the data's "content value."

The input binary data 102 is split 104 into segments, if necessary. The input binary data may be short enough that it is not further split. Each segment has a content value. The content value of each segment is identified and a transform along with appropriate state information is selected and tested 106 for each segment. A general transform is capable of representing many values. The state information provides the information necessary to specify an exact value for the transform. The term "state information" includes any variables, coefficients, remainders, or any other information necessary to set the specific numerical value for the transform. In some embodiments, "packet overhead," is added to the transform and state information. The packet overhead includes any information beyond the transform and state information needed to allow later recalculation of the original segment and reconstitution of the original input binary data.

The transform with its state information has the identical numerical value as the corresponding segment. The following equation represents the transform concept:

$$M = T(\text{State Information}),$$

where M is the content value of the segment, and T is the transform. The transform is an arithmetic transform, a logical transform, or another mathematical transform.

The transform with its state information and packet overhead has a representation efficiency gain ("REG"). The REG is a measurement of the efficiency of the transform, state information, and any packet overhead. The REG is defined as the ratio of $\text{Log}_2 M / \text{Log}_2 T$, where $\text{Log}_2 M$ is the number of binary bits required to represent M, and $\text{Log}_2 T$ is the number of binary bits required to decodably represent the transform, state information, and packet overhead. Thus, if the REG value is greater than one, the transform plus state information and packet overhead takes up fewer bits than the segment.

For example, a 9-bit size message is capable of representing the transform $a^{b^c}$, where each of a, b, and c is a 3-bit message. In this case, $a^b$ is the transform, and a, b, and c are each a variable of the transform. The values of a, b, and c make up the state information. Both the transform and the state information are necessary to make an expression whose numerical value is equal to the content value of the segment.

With the $a^b$ example above, nine bits are capable of representing an integer over 700,000 decimal digits long, equivalent to more than 2.3 million binary bits. As an example, this transform can represent the content value of 150,094,635,296,999,121, or $3^{6^2}$ using only nine bits. This number would occupy fifty-eight bits if conventionally represented in binary form. Thus, by using this transform, the 9-bit message transmits 58 bits of content value. The 58-bit data segment has been greatly compressed.

Each transform and accompanying state information are next packaged 108 into a packet. The packet includes additional packet overhead that provides any other information necessary to allow later unpackaging and recovery of the content value of the packet. This packet overhead can include information that identifies the segment, identifies the transform, or any other necessary information. The packet typically takes fewer bits to express than the original segment. Thus, the segment has been compressed.

Each packet is then stored or transmitted 110. Because the packet is typically smaller than the segment, storing the packet takes up less space than the segment, and transmitting the packet takes less time than transmitting the segment.

Figure 2:
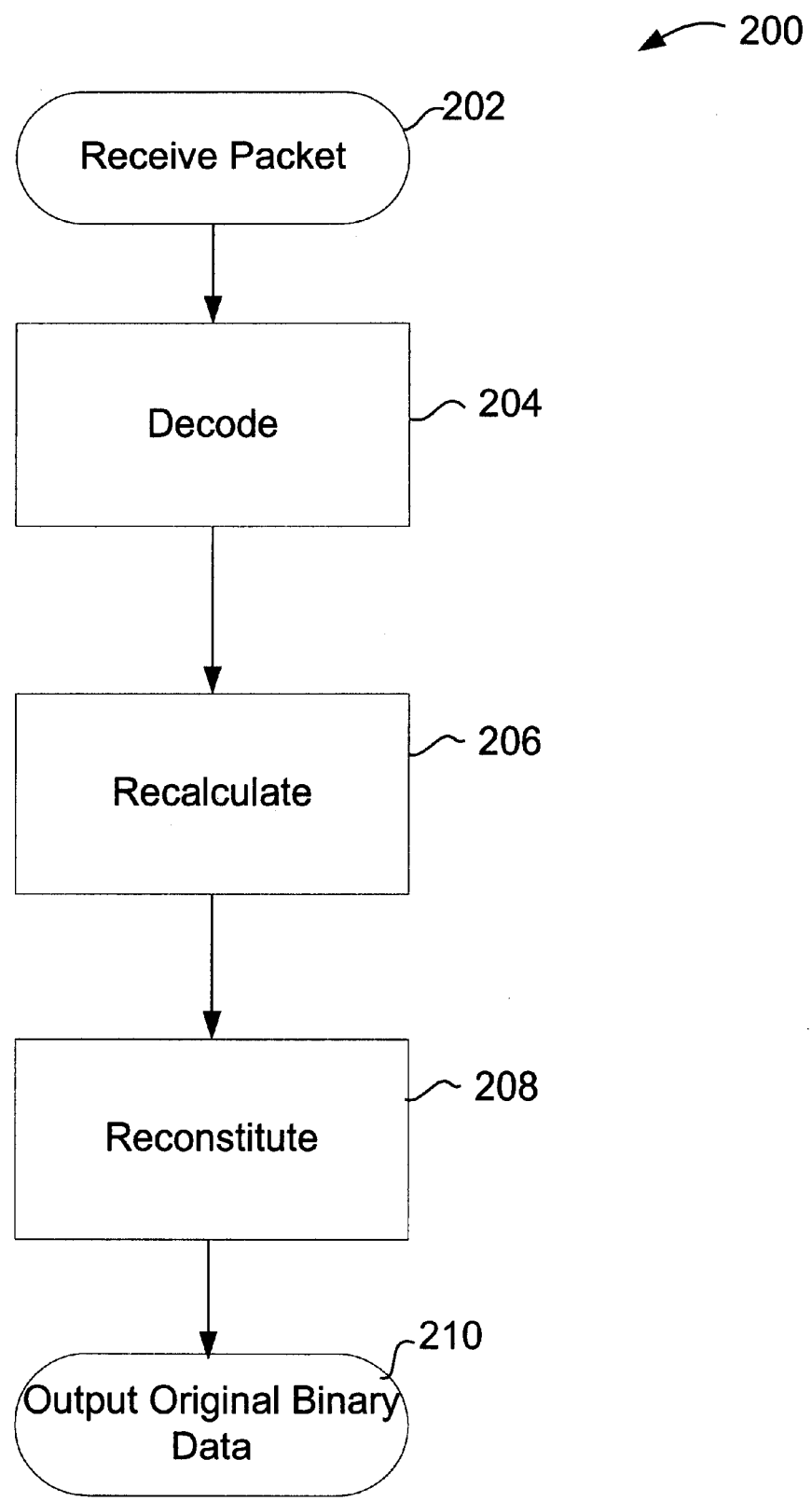
FIG. 2 is a flow chart showing an overview of the recovery process.

FIG. 2 is a flow chart showing an overview of the recovery process 200, in which the original data is recovered from packets. The packet is received 202 if it has been transmitted, or retrieved from storage if it has been stored. Next, the packet coding is decoded 204 to determine the identity of the transform and how to use the state information to recover the original segment. Using the decoded information, the original segment's content value is recalculated 206. Finally, all recomputed segments are put together again in their original order to reconstitute 208 the original input binary data. Thus, the output 210 of the recovery process 200 is identical to the input 102 of the compression process.

System Overview

Figure 3:
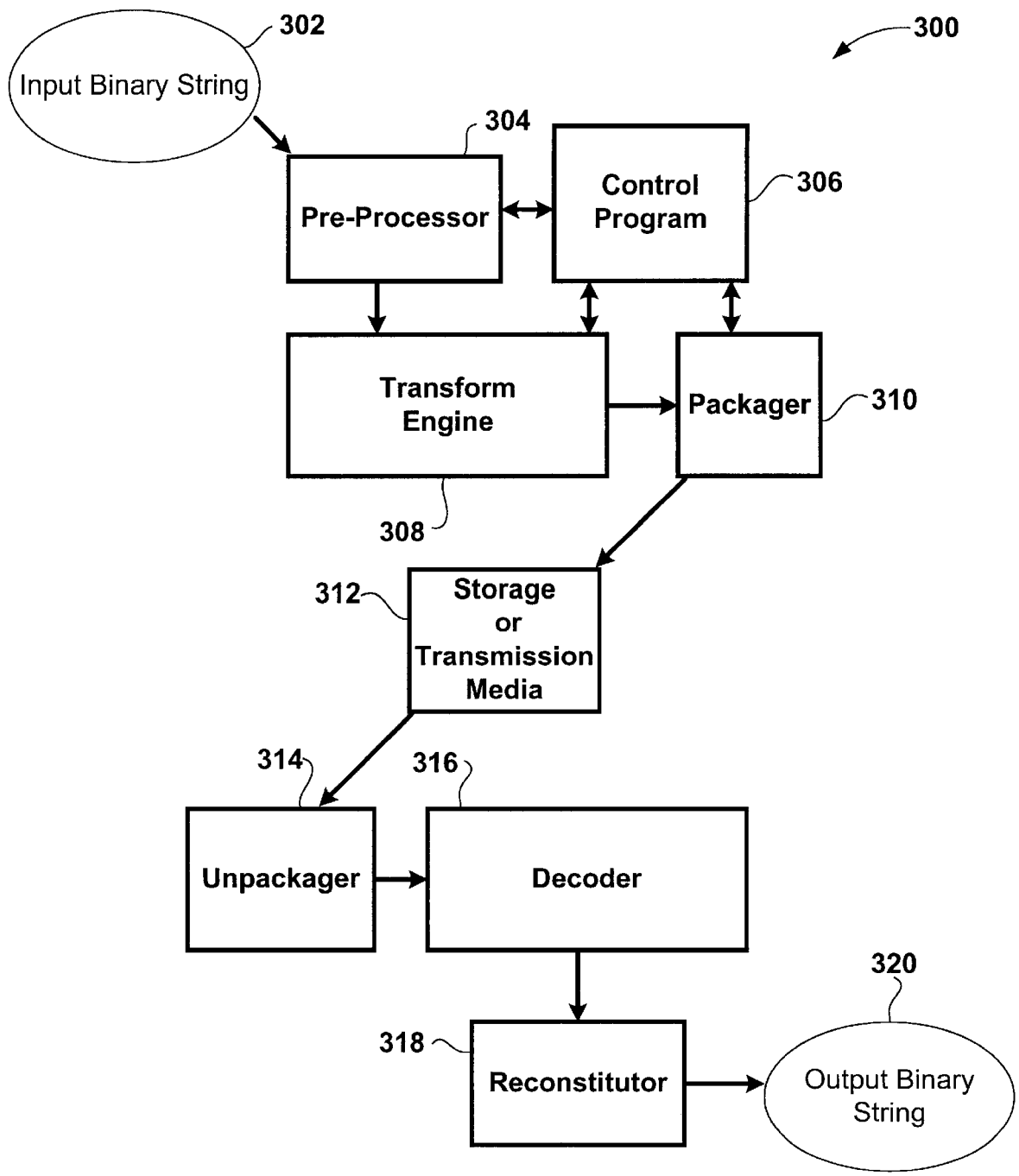
FIG. 3 is a block diagram of the compression system and illustrates the general flow of data through the compression system.

FIG. 3 is a block diagram of the compression system 300 and illustrates the general flow of data through the compression system 300. The compression system 300 performs the processes of FIGS. 1 and 2. The flow through the compression system 300 starts with the input of a binary string 302 that is to be compressed.

The control program 306 serves as the process controller for all compression system 300 functions. The control program 306 monitors other compression system 300 components and tracks all information related to the input binary string throughout processing. The control program 306 also interacts with and terminates any process according to time, trial, or other parameters.

The pre-processor 304 takes the input binary string 302 and splits the binary string 302 into segments. The length of each segment is appropriate to a given data type, transforms likely to be used, processor capacity, and application parameters. In some situations, the pre-processor 304 also mutates the segments in order to give more favorable variations of a segment to the transform engine 308.

The transform engine 308 receives the segments from the pre-processor 304 and computes permutations of transforms and state information, each permutation equivalent to the content value of the segment. The size of each permutation, including associated packet overhead, is analyzed, and the most efficient combination of transform, state information, and packet overhead is selected. If the permutations show no data compression, the segment is sent unmodified to the packager 310 as raw data.

The packager 310 receives the output of the transform engine 308. For each segment, the packager receives from the control program 306 all relevant information, including state information, as to how the segment was transformed. From the transform, state information, and other associated information, the packager 310 creates a packet. Thus, the packet includes the transform, state information, and packet overhead information that together allows later decoding of the packet.

At this point, the input binary string 302 has been segmented, transformed, and packaged into packets. Together, the packets are smaller than the original input binary string 302. These packets can be either stored or transmitted through established storage and transmission protocols 312. Because the packets are smaller than the original input binary string, they have the advantage of taking less storage space and being transmitted more quickly than the original binary data.

The unpackager 314 receives the packet if the packet has been transmitted, or retrieves the packet from storage if the packet has been stored. The unpackager 314 interprets the packet overhead instructions, unpacks the packet components and associated information for use by the decoder 316, and unpacks any unmodified data as raw data segments.

The decoder 316 receives the unpackaged information from the unpackager 314 and recalculates the content value of the original segment. The decoder 316 applies the state information to the appropriate transform(s) to recalculate the content value of the segment. If the data was mutated, the process is reversed for that given segment to recover the original format of the segment.

The reconstitutor 318 receives the segments from the decoder 316 and concatenates the segments in sequence to reconstitute the original binary string. Based on application parameters, this can be done to an entire file or streamed as needed by the application. The reconstitutor 318 then outputs the binary string 320. The binary string 320 output by the reconstitutor 318 is identical to the input binary string. Thus, the compression system 300 provides lossless compression.

Control Program

The control program 306 tracks data related to each data segment and transformation of the segment, as well as information regarding the pre-processor 304, the transform engine 308, and all other compression system 300 functions. This information can include, but is not limited to:

1. The identification of each segment, including information providing the location of the segment within the original input binary string
2. The size of each segment
3. The data type of each segment
4. Computational power of the transform engine 308
5. Computational power of the decoder 316
6. Application requirements, such as time constraints for real-time streaming applications
7. Data type requirements
8. Whether the segment has been mutated, and the technique used to mutate the segment
9. Time spent on the segment by the pre-processor 304
10. Computational cycles spent on the segment by the pre-processor 304
11. Time spent on the segment by the transform engine 308
12. Computational cycles spent on the segment by the transform engine 308
13. The identity of the transform or transforms used for the segment
14. Any Combinatorial Optimization Heuristics used to select state information variables
15. Tracking information related to any heuristic used
16. Successful transform(s)
17. State information of successful transform(s)
18. Bit-length of transform reference(s) and associated state information for successful transform(s)
19. Bit-length of associated packet overhead for successful transform(s)
20. Partial solution transform(s)
21. State information of partial solutions (including offsets)
22. Bit-length of transform references and associated state information for partial solutions
23. Bit-length of packet overhead for transforms used by partial solutions
24. Finite State Machine(s) used
25. Finite State Machine information, such as reference data and Finite State Machine tree data
26. de Bruijn Sequence starting point and log of index
27. 3-D Graph Tree tracking information
28. N-space curve data
29. "BOTS" used
30. BOTS information, such as content value locations of BOTS and deltas from BOTS to segment content value The process monitor (not shown) is a major subpart of the control program 306. The process monitor monitors the pre-processor 304 and the transform engine 308. The process monitor has parameters that constrain the operations of the pre-processor 304 and transform engine 308. These constraint parameters can include a target REG, the time spent processing, the number of computational cycles spent processing, or other parameters. A target REG is a REG value that is sufficiently high so that the compression system 300 stops searching for higher REG transforms when a combination of transform, state information, and packet overhead with the target REG is found. The constraint parameters for time spent processing and computational cycles spent processing ensure that the compression system 300 does not spend an indefinite amount of time and resources searching for the best combination of transform and state information. The parameters are preset or changed by the control program 306. The parameters are changed if the data type changes, if the computational resources change, if the application changes, or by human or other external intervention.

If the pre-processor 304 or the transform engine 308 exceeds a constraint parameter, the process monitor signals the control program 306 to terminate pre-processor 304 or transform engine 308 operations. When pre-processor 304 operations are terminated, the binary string is split into segments. The length of the segments are the best approximation of optimum length thus far determined by the pre-processor 304. When transform engine 308 operations are terminated, the transform engine 308 will output the current best transform and state information, or, if no transforms compress the data, send the segment as raw data.

Pre-Processor

Figure 4:
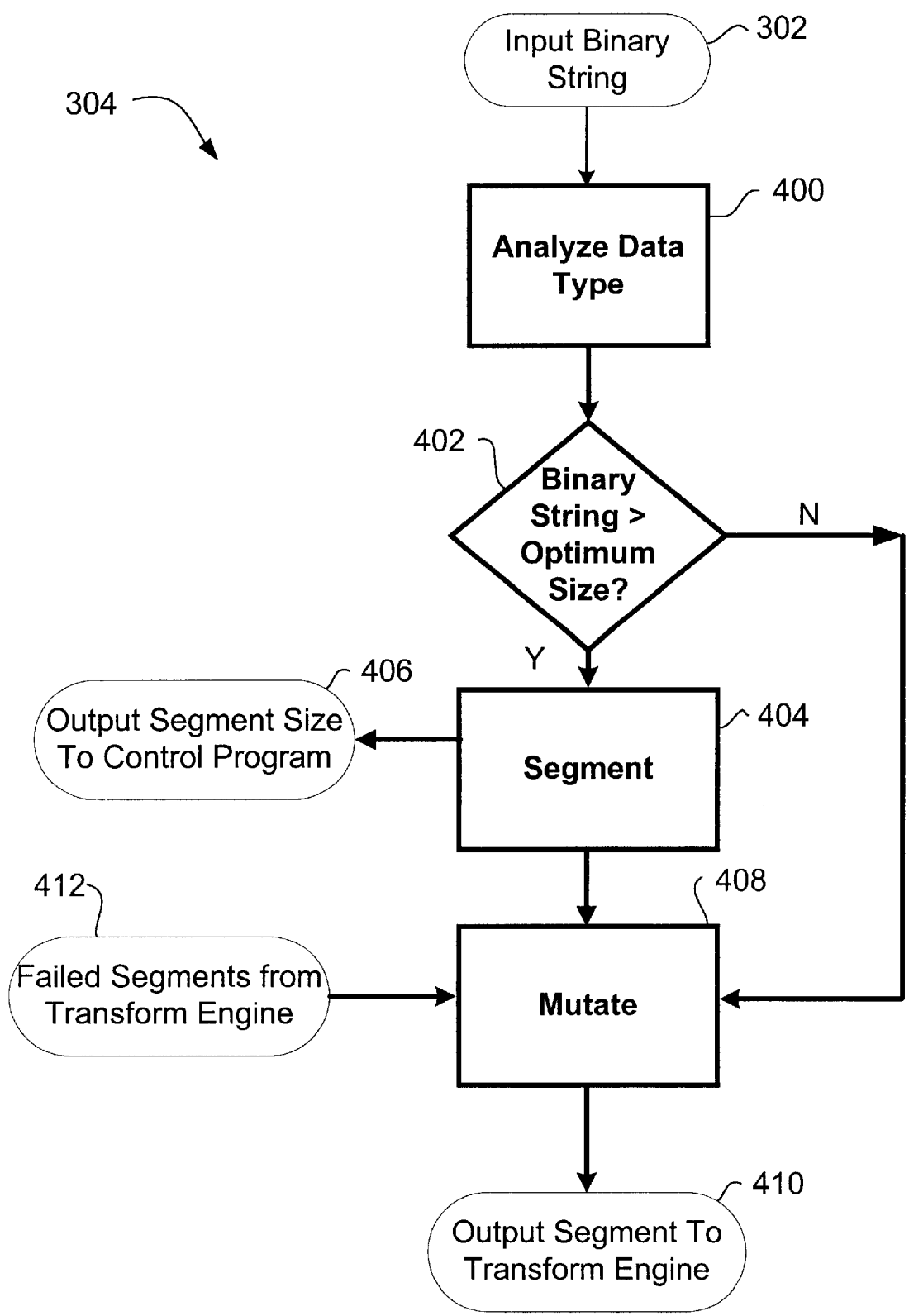
FIG. 4 is a flow chart of the pre-processor.

FIG. 4 is a flow chart of the pre-processor 304. First, the pre-processor 304 analyzes 400 the data type of the binary string 302. In analyzing the data type, the pre-processor 304 attempts to identify or characterize the data type of the binary string 302. The data type is used to help determine which segment size, which transform, and which state information for the transform, which will be used to test and transform the binary data. The pre-processor 304 characterizes the binary string 302 by either knowing which application generated the binary string 302 or by analyzing the data itself. One method for analyzing the data to determine the data type is comparing the binary string 302 to an existing database of data types. One method for generating such a database is by sampling information generated by known digital applications.

If the pre-processor 304 characterizes the binary string 302, the control program 306 stores the data type associated with that string. If the pre-processor 304 cannot characterize the binary string 302, the control program 306 keeps a record that the binary string's 302 data type is unknown.

The pre-processor 304 next determines 402 whether the size of the input binary string 302 is greater than a minimum optimum processing block size. The minimum optimum processing size is different for different data types. The control program 306 stores each known minimum optimum processing size associated with the corresponding data type. If the pre-processor 304 has characterized the data type and the minimum optimum processing size for that data type is known, the pre-processor 304 simply compares the input binary string 302 to the stored minimum optimum processing size.

If the data type is unknown, or an optimum size for a data type is unknown, the binary string 302 is split 404 into segments of a size that has worked well previously with many types of data. Alternatively, the binary string 302 is initially split 404 into segments of differing bit-lengths. As these segments of differing bit-lengths are processed by the compression system 300, the control program 306 keeps a record of which segment sizes are most easily processed. By trying different sizes, and tracking which sizes work best, the control program 306 builds a record of an optimum processing size for each data type, so that the optimum processing size for that type of data becomes known. If the control program 306 develops a record of an optimum processing size for a data type, that segment size can be incorporated for future use.

If the input binary string 302 is larger than the minimum optimum processing block size, the binary string 302 is split 404 into segments. The bit-length of the segments is determined by several factors.

The computational power of the transform engine 308 affects the bit-length of the segments. If the transform engine 308 has little computational power available, the segments must be shorter than if the transform engine 308 has a great deal of computational power. Similarly, if the computational power of the decoder 316 is known, it will influence the bit-length of the segments. The more computational power the decoder 316 has, the greater the bit-length of the segment can be.

The application using the compression system 300 also affects the bit-lengths of the segments. For instance, applications such as video conferencing, which require human-perceptible real-time encoding, require shorter segments than those of off-line archiving where larger segments can be transformed and encoded over longer timeframes and more processing cycles.

The data type also affects the bit-lengths of the segments. For instance, audio data may lend itself to different segment sizes than ASCII data. Another factor related to data type is what transforms will likely be used with the data type. The transforms used with a particular data type may perform better with a specific segment length. The control program 306 monitors the transform engine 308 and stores which transforms work well with specific data types, which segments sizes work well with those transforms, and which segment sizes can be incorporated for future use. Thus, when the pre-processor 304 successfully characterizes a data type, the control program 306 is capable of retrieving information as to the optimum bit-length of the segment.

If the input binary string 302 is equal to or smaller than the minimum optimum processing block size, the binary string 302 is treated as a single segment. Each segment, whether it is a portion of the split binary string 302, or the entire binary string, is treated the same throughout the rest of the compression system 300.

The segment size is output 406 to the control program 306. The control program 306 stores the segment size and uses it to compare to the size of possible combinations of transform, state information and packet overhead.

The control program 306 assigns to each segment specific identification information so that the original binary data may be reconstituted later, and tracks each of the segments, along with the identification information, associated data type, settings for the process monitor, and any other associated data.

Each of the segments may next be mutated 408. The segment is mutated 408 if the control program 306 has stored information indicating that previously, mutated segments of that data type and segment size resulted in successful transforms, or that unmutated segments of that data type and segment size did not result in successful transforms. If the control program 306 has no information stored that indicate that a mutated segment would result in successful transforms, the segment is not mutated. However, the segment may subsequently be returned 412 from the transform engine 308 to be mutated if a successful transform for the unmutated segment is not found.

The pre-processor 304 mutates 408 segments by creating different versions of the segment to provide the transform engine 308 with more permutations of the same segment. By providing more permutations of the segment, the likelihood of finding an efficient transform is increased. Some segments for which the transform engine 308 failed to generate an efficient transform 412 are also returned to the pre-processor 304 and mutated 408.

By monitoring and storing information on which data type and segment sizes are returned to the pre-processor 304 to be mutated 408, the control program 306 gains information on which data types and segment sizes should be initially mutated. Further, by monitoring mutated segments through the compression system 300, the control program 306 gains information on which mutations result in successful transforms. This information can be re-incorporated into the control program.

There are several ways to mutate the segment. If the control program 306 has a record stored of which mutating technique has resulted in successful transforms, that mutating technique is used. If the control program 306 does not have such a record, the mutating technique is chosen by stepping through a stored library of possible mutations.

In a first mutating technique, the bit-length of the segment is adjusted. This involves splitting a group of segments differently. By doing so, the pre-processor 306 sends different content values to the transform engine 308 to process. Another technique is "cutting and shuffling" the data. A predefined shuffle library is used. The index of the shuffle is included as part of the packet overhead. Yet another technique is finding the complement of the segment and sending the complement to the transform engine 308. In another technique, the bits within the segment are shifted or rotated. When the bits are shifted or rotated, the direction and number of bits to rotate or shift is sent as part of the packet overhead. The segment can be modified by an arithmetic (scaling) or logical (XORing) operation. In an alternate technique, other traditional compressions are used to change the content value of the segment.

The control program 306 tracks mutated segments, and how the mutated segments were mutated. This information is provided to the packager 310 so that the packager 310 can add the associated appropriate packet overhead codes. These codes identify the data as mutated data, as well as how the data has been mutated.

The segments, mutated or not, are next output 410 to the transform engine 308.

Transform Engine

Figure 5:
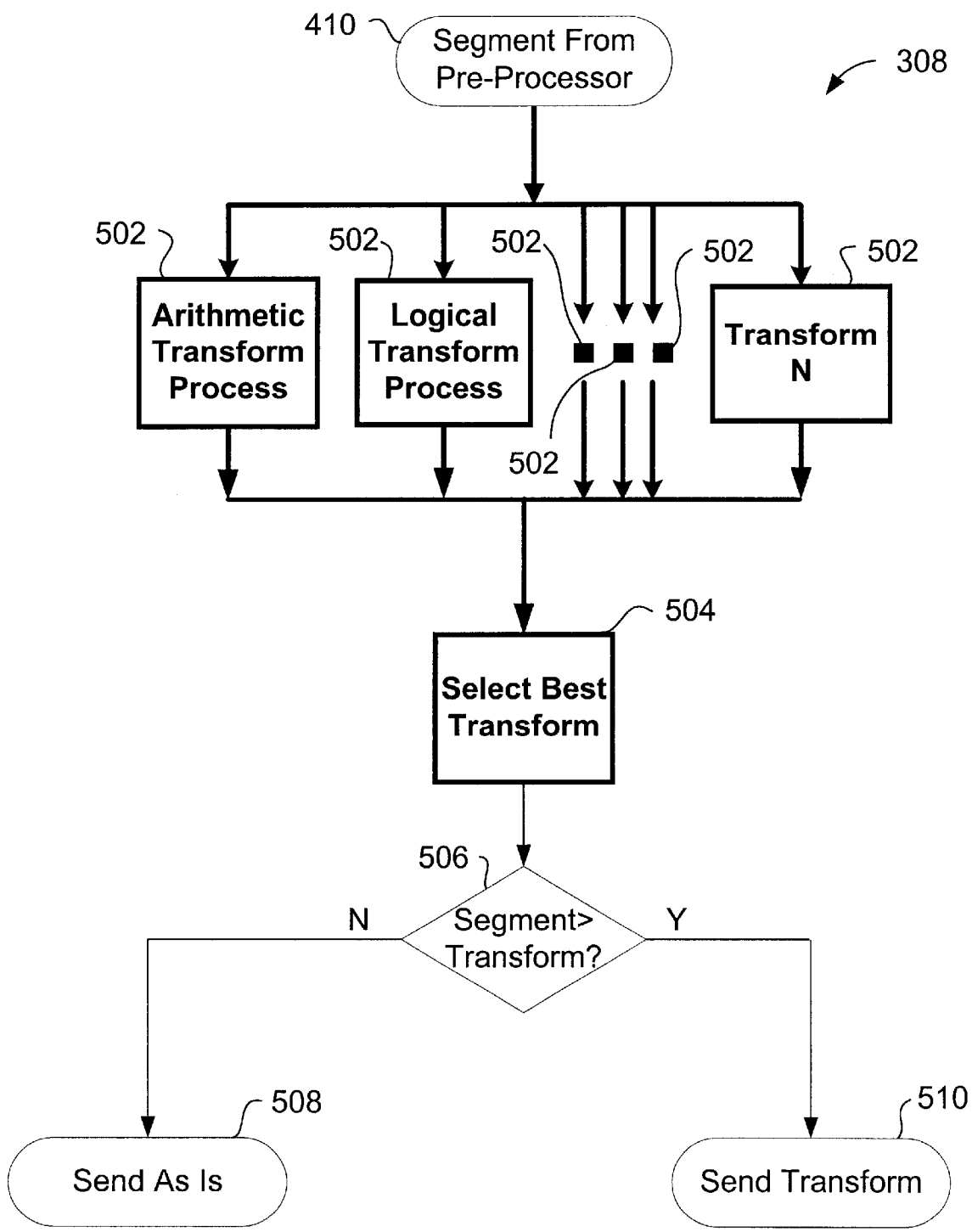
FIG. 5 is a flow chart of the transform engine.

FIG. 5 is a flow chart of the transform engine 308. The segment output by the pre-processor 304 is input 410 to the transform engine 308. The segment is sent to as many transform processes 502 as are available and as computational resources allow. The segment is processed by the transform processes 502 either serially or in parallel.

Each transform process 502 provides another transform (or transforms) available to represent the content value of the segment. The transform engine 308 has multiple transform processes 502 available to it since a single transform may not be appropriate to the content value of every input segment. This is seen from studying the example, discussed previously, of the 9-bit size transform a, where each of a, b, and c is a 3-bit message. Using this transform, the content value of an integer over 700,000 decimal digits long can be transmitted using only nine bits. Such a number would occupy over 2.3 million bits if conventionally represented. While this transform provides the capability for nine bits to transmit a 2.3 million-bit number, the nine bits still are only capable of conveying less than 512 different messages, corresponding to 512 different content values. Therefore, there exist a significant number of values between 0 and $7^{7^7}$ that the transform $a^{b^c}$ cannot represent.

Normally, arithmetic transforms include a remainder R, so that the previously examined $a^{b^c}$ transform becomes $a^{b^c}$+R. After values are chosen for a, b, and c, the transform is set equal to the content value and solved for the remainder. This allows the transform to represent any content value. However, in many cases the remainder R will be a large number, requiring many bits to represent. This results in little or no compression of the segment. By providing multiple different transform processes 502, the transform engine 308 greatly increases the chances of finding a transform with no remainder, or a remainder small enough so that a compressive REG is reached.

Further, having multiple transform processes 502 allows hybrid solutions to be found. In a hybrid solution, more than one transform is used. For example, one transform may be capable of representing a wide range of content values, from zero to a very large integer. However, this transform has a low granularity without using remainders. For the large majority of content values represented by the transform, a large remainder, requiring many bits to represent, is needed. Instead of using the large remainder, a second transform is used to represent the remainder. The second transform is capable of representing a smaller range of values than the first transform, but with better granularity and typically smaller remainders. In one embodiment, the remainder from one transform process 502 is input into another transform process 502. The second transform process 502 treats the input remainder as it would treat any other segment. Thus, instead of a transform with a large remainder, a hybrid solution consists of multiple transforms with a small remainder.

The transform processes 502 each test transform solutions for the segment. A transform solution is a transform combined with specific state information. Transform processes 502 continue to test permutations of state information, transforms, and packet overhead until the target REG is met, or a time, number or trials, or other constraint bound is reached. The process monitor monitors the transform processes 502 to determine if the target REG, the time spent processing, the number of computation cycles, or other constraint bounds have been met. The process monitor stops the transform processes 502 upon meeting a constraint bound.

The control program 306 selects 504 the best combination of transform, state information, and packet overhead that has been tested by the transform processes 502. To select the best combination, the control program 306 measures the bit-length of each transform, state information, and the associated packet overhead. The permutation that requires the smallest bit-length to represent the transform, state information, and associated overhead is the best permutation.

The control program 306 also continually tracks the tested permutations. At times, a combination of transform, state information, and overhead may not be the best combination for a single segment, but is the best combination if applied to multiple segments, with common information sent in only one packet, and implied in the rest. The control program 306 monitors for such combinations, and if they occur, this combination is the best permutation.

The bit-length of the best combination of transform, state information and overhead is compared 506 with the bit-length of the raw segment 406 and the associated packet overhead used to flag the raw segment. If the bit-length of the best permutation of transform, state information, and associated overhead is shorter than the bit-length of the raw segment 406 and the associated packet code that flags the raw segment, the transform and state information are output 510. Otherwise, the raw segment is output 508.

Transform Process

Figure 6:
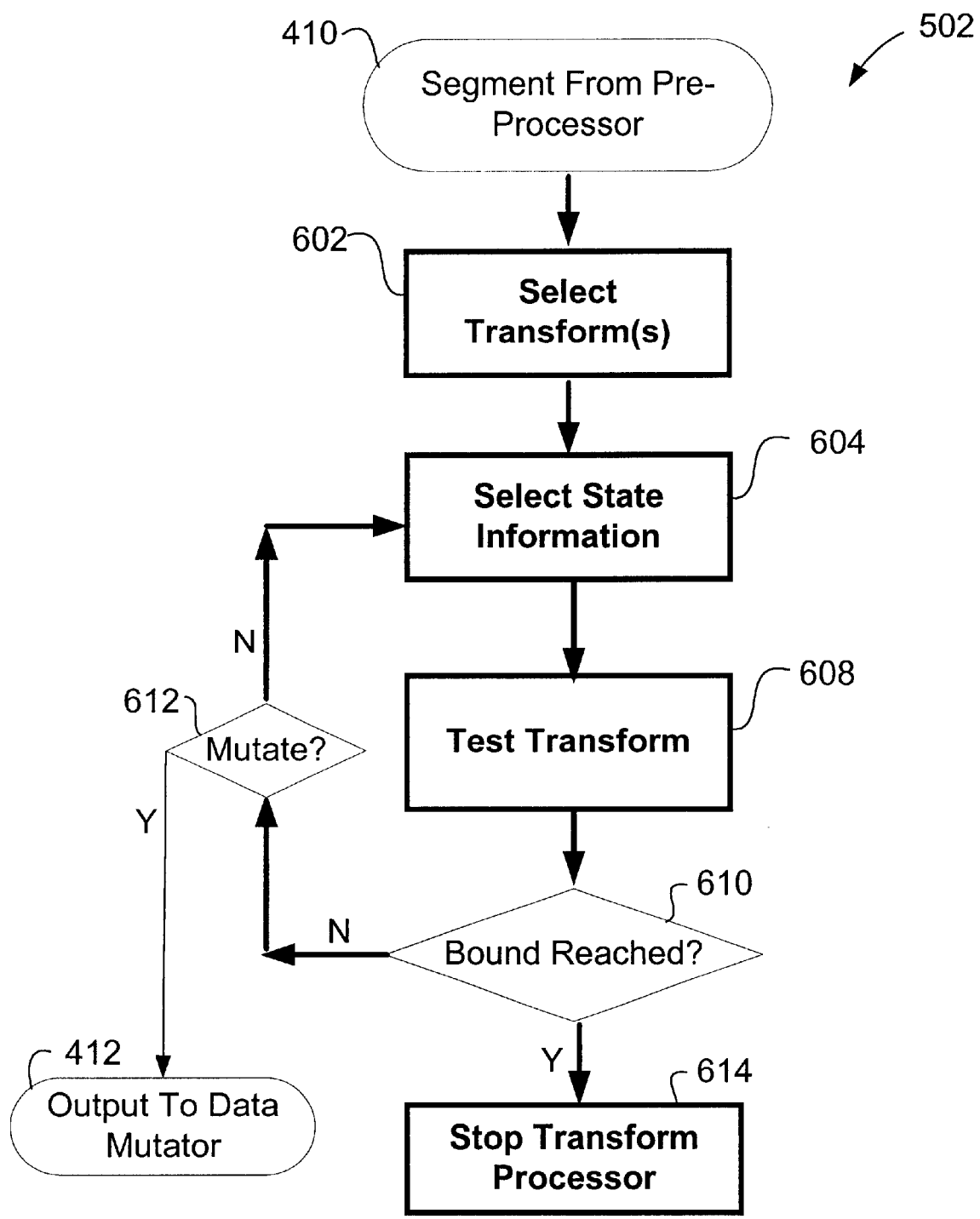
FIG. 6 is a flow chart of a transform process.

FIG. 6 is a flow chart of a transform process 502, showing how the transform process 502 tests combinations of transforms and state information of the segment. The segment output by the pre-processor 304 is input 410 to the transform process 502.

The transform process 502 selects 602 a transform (or set of transforms) to test. A transform process 502 is capable of utilizing many different transforms. The transforms used by the transform process 502 are stored in a transform database. Based on the size of the data segment, data type, pre-processing performed, and other factors that the control program 306 tracks for the segment, one or more transforms are selected from the transform database. If the control program 306 has a record stored of which transform has resulted in successful compression for segments with the same or related factors, that transform is selected. If the control program 306 does not have such a record, the transform is chosen by stepping through the transform database based on data type or other heuristics. The control program 306 then stores which transforms prove successful to develop a record of which transform has resulted in successful compression for segments with the same or related factors. This information can be re-incorporated into the control program.

If the transform process 502 selects 602 multiple transforms, the transform processor may use a hybrid solution, partial solutions, or other combinations of transforms. A hybrid solution uses additive sequences of transforms to represent the content value of the segment. A partial solution represents different portions of a segment using the same or different transforms.

In a hybrid solution, multiple transforms are combined to represent the content value. Efficient coverage of all possible content values is difficult to achieve using a single transform. For example, a transform may result in large remainders and little compression, as discussed above. Instead, transforms are combined to create an effective additive sequence where the combinations of content values of transforms with a range of state information values fill in gaps left by a different set of transforms. For example, a content value $M_1$ is solved for as follows: $M_1$= (Transform1)$_{vs1}$+(Transform2)$_{vs2}$+(Transform3)$_{vs3}$+ . . . + (Transformn)$_{vsn}$, (where vs is a variable set for that transform). Similarly, for a second content value $M_2$, $M_2$= (Transform1)$_{vs4}$+(Transform2)$_{vs5}$+(Transform3)$_{vs6}$+ . . . + (Transformn)$_{vsn}$, and for a third content value, $M_3$= (Transform1)$_{vs7}$+(Transform2)$_{vs8}$+(Transform3)$_{vs9}$+ . . . + (Transformn)$_{vsn}$.

Another method using multiple transforms is a partial solution. In a partial solution, instead of a full transform, the transform process 502 selects transforms for parts of the segment. To select partial transforms, a collection H of triples of the form (beginning, end, and compression length), representing known bit strings for which the transform provides compression, are found. The known bit strings are bit strings with content values that the transform is equal to for a known set state information. The transform process 502 finds the combination of these triples that minimize the total length plus the length of the uncovered portion of the segment.

Specifically, the segment is a bitstring M of length n. The control program 306 provides the transform process 502 a target REG B, and a finite collection H of positive solutions. Each positive solution is a triple h=(i(h),j(h), c(h)) where $1 \leq i(h) < j(h) \leq n$ are the beginning and the end of the known bit string, and c(h) the length of its description. The transform process 502 chooses a subset $S \subseteq H$ of the given positive solutions so that its cumulative length (for non-overlapping partial solutions) obeys:

$$x = \sum_h [c(h) + l(i(h)) - (j(h) - i(h))]$$

where l(i(h)) is the number of bits necessary to represent i(h). Partial solutions may occur anywhere within the segment. High efficiency combinations of transforms and associated state information are tested up and down the segment in search of best matches with part of the segment. Multiple matches of transform and associated state information can be found for the segment. Each combination of transform and associated state information represents part of the segment. Together, the summed bit-lengths of the transforms, state information for each selected transform, and raw data portions of the segment plus packet overhead provide compression over the original segment.

After selecting the transform or transforms, state information for the transform(s) is selected 604. In some embodiments, numerical techniques are used to aid in the selection of appropriate state information. These numerical techniques include Newton's method, bisection, secant methods, and other numerical techniques for finding roots of equations. The previous example arithmetic transform of $a^{b^c}+R$ illustrates the selection of state information. In this transform, the variables a, b, c, and R make up the state information. The transform process 502 selects values for a, b, and c. The transform process 502 uses one of several numerical techniques to select the values. Then, the remainder R is solved for so that the sum of R and the rest of the transform equals the content value M. Thus, with arithmetic transforms, the transform process 502 can select any values for all the variables except R, then solve for R so that the value of the transform with its state information is identical to the content value of the segment.

After the state information has been selected, the transform with the selected state information is tested 608. In testing, the control program 306 determines the bit-length necessary to represent the transform along with all state information and the associated packet overhead that would be used in the final packet. If the bit-length is shorter than a REG target bit-length, or if the bit-length is shorter than the bit-length for other combinations of transform, state information, and packet overhead that have been tested, the transform, state information, and packet overhead are stored and marked as a possible best transform permutation.

Next, the process monitor determines if a constraint bound has been reached 610. The constraints include number of trials, time spent on trials, number of computational cycles, target REG, or other constraints. If a constraint bound has been reached, such as a target REG met, or a time limit for processing reached, the process monitor stops 614 the transform process 502. At this point, the best combination of transform, state information, and packet overhead that has been tested in that transform process 502 is output so the best transform permutation from all the transform processes 502 can be selected 504.

If a constraint bound has not been reached, the transform process 502 determines 612 whether the segment should be mutated. If, after multiple sets of state information are tested for the transform, the control program 306 determines that the bit-lengths of the permutations of the transform(s), state information, and packet overhead tested 608 are too large, the segment will be returned 412 to the pre-processor 304. In the pre-processor 304, the segment is mutated and then sent back to the transform engine 308. Otherwise, the transform processes 502 will select 604 another set of state information to be tested.

Thus, the transform process 502 includes a loop that tests permutations of the transform with different state information. If the control program 306 determines that the transform is not resulting in desirable bit-length packets, the loop is halted and the segment is mutated. When a constraint bound is reached, the loop is halted and the best combination of transform, state information, and packet overhead found to that point is output.

Transforms

The following is a description of several different transforms suitable for use by the transform processes 502. While the following list of transforms is lengthy, it is by no means complete. The transform processes 502 are capable of making use of many transforms, including the standard mathematics described in such texts as Herbert Dwight's, *Tables of Integrals and other Mathematical Data*, Milton Abramowitz's and Irene Stegun's, *Handbook of Mathematical Functions*, Alan Jeffery's, *Handbook of Mathematical Formulas and Integrals*, and N. J. A. Sloane's and Simon Plouffe's, *The Encyclopedia of Integer Sequences*.

Many transforms fall into the class of arithmetic transforms. These arithmetic transforms include, but are not limited to:

Exponential Factoring: Exponential factoring takes a general form of $T(x)=x^n+R$. For a content value M, the transform process 502 determines values for the transform variables x, n, and R. The transform variables make up the state information for the transform. For example, if a 64-bit data segment $M=3E1386BE8784F351_{16}$ is submitted to be transformed, then setting M equal to the expansion gives $M=x^n+R$. The transform process 502 selects values for the transform variables x and n and solves for R. For example, selecting $n=15_{16}$ and $x=11_{16}$, results in R=0. Since M=T(x), the segment can be represented by the identity of the transform and the state information x, n, and R.

The transform process 502 similarly selects values for the variables except for the remainder R, and then solves for the remainder R for the other arithmetic transform families listed below.

Power Series: A power series takes the form of $T(x)=(a+x)^n+R$, with transform variables x, a, n, and R. Expanded to the fourth order around x=0, the series becomes:

$$T(x)=a^n+na^{n-1}x+n(n-1)a^{n-2}x^2+n(n-1)(n-2)a^{n-3}x^3+n(n-1)(n-2)(n-3)a^{n-4}x^4+R$$

Polynomials: Another transform family is the polynomials. A sample polynomial with transform variables a, b, c, d, x, y, and R is:

$$T(x)=ax^5y^3+bx^4y^2+cx^3y+d+R.$$

Geometric Series: Geometric series are another transform family. For example, $$T(x) = \sum_{n=1}^{m} ax^n + R,$$

with transform variables x, m, a, and R.

Integer Series: Integer series provide additional transforms. An example integer series is:

$$T(x) = \sum_{i=0}^{n} (a_i + x)^x + R,$$

with transform variables x, n, $a_i$, and R.

Trigonometric Functions: The trigonometric transform family is also capable of yielding impressive results. An example trigonometric transform with transform variables x and R is:

$$T(x) = \frac{\text{Sin}(x)}{x^2} + R.$$

Bessel Functions: Bessel Function families are also acceptable transforms. For example, $$T(x) = \sum_{n=0}^{\infty} \frac{x^n}{(n!)^2} + R,$$

with transform variables x and R.

Asymptotic Series: Asymptotic series are also capable of yielding a sizable representational efficiency gain. For example, $$T(x) = 1 + \frac{1}{x} + \frac{1}{2}\left(\frac{1}{x}\right)^2 + \frac{1}{6}\left(\frac{1}{x}\right)^3 + R,$$

with transform variables x and R.

Other transforms that the transform processes 502 are capable of using include: infinite products, continued fractions, Diophantine equations, Mobins functions, algebraic curves, integral transformations, inverse circular (Trigonometric) functions, spherical trigonometric functions, logarithmic functions, hyperbole functions, orthogonal polynomials, polylogarithms, Legendre functions, elliptic integrals, sequence transformations (z-transform), Markov chains.

Another basic class of transforms is logical. Logical transforms are similar to the arithmetic transforms. Using logical or Boolean constructs (i.e., AND, OR, NOT) instead of arithmetic operators, the content value is described in a solution whose representation takes fewer bits than the segment. Examples of logical transforms include, but are not limited to, using the disjunctive normal form ("DNF") or using a Finite State Machine (sometimes called Finite State Automata or "FSA").

DNF: Every finite Boolean algebra B is isomorphic to $\{0,1\}^M$ for some positive integer M using bitwise operators. A formula or expression driven function on n Boolean variables is a function $f: B^n \to B$ in which the expression completely and uniquely determines the action of f. The DNF logical transform uses Boolean operators (AND ·, OR +, and NOT ~) and a set of pre-defined Boolean basis strings known to both packager 310 and decoder 316. Alternatively, basis strings are used which are not initially known to the decoder, but are sent to the decoder once in a packet and used with a number of subsequent packets.

Each formula driven function is completely determined by its actions on the Boolean variables. For example, if n=3 Boolean variables, then there are $2^n$ or 8 (i.e., $2^3$) inputs, and there are $2^8$ or 256 such functions on 3 variables. The DNF is the standard or canonical way to express these 256 functions by determining the coefficients of the terms of the standardized function. The coefficients are either 0 or 1 indicating the presence or absence of a term. The standard DNF expression for n=3:

$f(x_1, x_2, x_3)=$ $c_1(x_1 \cdot x_2 \cdot x_3)$ $+c_2(x_1 \cdot x_2 \cdot \sim x_3)$ $+c_3(x_1 \cdot \sim x_2 \cdot x_3)$ $+c_4(x_1 \cdot \sim x_2 \cdot$ $\sim x_3)+c_5$ $(\sim x_1 \cdot x_2 \cdot x_3)$ $+c_6(\sim x_1 \cdot x_2 \cdot \sim x_3)$ $+c_7(\sim x_1 \cdot \sim x_2 \cdot x_3)$ $+c_8(\sim x_1 \cdot \sim x_2 \cdot \sim x_3)$ Thus, for an arbitrary 8-bit binary string 11110100, the standard DNF expression is:

$f(x_1, x_2, x_3)=1(x_1 \cdot x_2 \cdot x_3)$ $+1(x_1 \cdot x_2 \cdot \sim x_3)+1$ $(x_1 \cdot \sim x_2 \cdot x_3)+1$ $(x_1 \cdot \sim x_2 \cdot \sim x_3)$ $+0(\sim x_1 \cdot x_2 \cdot x_3)+$ $1(\sim x_1 \cdot x_2 \cdot \sim x_3)+0(\sim x_1 \cdot \sim x_2 \cdot x_3)$ $+0(\sim x_1 \cdot \sim x_2 \cdot \sim x_3)$ where the sequence of eight coefficients (one for each term of the DNF) is just the bit values of the binary string to be represented. Hence, each of the 256 distinct 8-bit strings can be uniquely represented by one of the 256 different standard DNF functions, since the coefficients are just the bit values of the bit string which is represented.

Although there is only one DNF function for a given bit string, there are many different ways to express this function in terms of the known standard basis strings. Using the prior example, the standard DNF function is:

$f(x_1, x_2, x_3)=1(x_1 \cdot x_2 \cdot x_3)+1$ $(x_1 \cdot x_2 \cdot \sim x_3)+1(x_1 \cdot \sim x_2 \cdot x_3)+1$ $(x_1 \cdot \sim x_2 \cdot \sim x_3)+$ $1(\sim x_1 \cdot x_2 \cdot x_3)$ which can also be expressed as:

$$f(x_1, x_2, x_3) = (x_1 \cdot x_2) + (x_1 \cdot \sim x_2 \cdot x_3) + (x_1 \cdot \sim x_2 \cdot \sim x_3) + (\sim x_1 \cdot x_2 \cdot \sim x_3)$$

which can also be expressed as:

$$f(x_1, x_2, x_3) = (x_1 \cdot x_2) + (x_1 \cdot \sim x_2) + (\sim x_1 \cdot x_2 \cdot \sim x_3)$$

The following is an example set of basis strings:
BS0=AAAAAAAAAAAAAAAA$_{16}$,
BS1=CCCCCCCCCCCCCCCC$_{16}$,
BS2=F0F0F0F0F0F0F0F0$_{16}$,
BS3=FF00FF00FF00FF00$_{16}$,
BS4=FFFF0000FFFF0000$_{16}$, and
BS5=FFFFFFFF00000000$_{16}$.

For example, a segment with a content value of M=7766554433221100$_{16}$ is submitted to be transformed using a DNF and the example set of basis strings. The following is a sub-optimized solution to this transform that is equivalent to M:

$$M = (((\sim BS5 \cdot BS3 \cdot \sim BS1) + (BS5 \cdot \sim BS3 \cdot BS1) + (BS5 \cdot BS3 \cdot \sim BS1) + (BS5 \cdot BS3 \cdot BS1)) \cdot ((\sim BS5 \cdot \sim BS0) + (BS5 \cdot BS0))) + (((\sim BS5 \cdot BS4) + (BS5 \cdot BS4)) \cdot ((\sim BS1 \cdot BS0))).$$

In the solution above, the expression equivalent to M depends only on three basis strings, rather than all six basis strings.

Finite State Machine/Automata: An FSA is a state machine with a number of fixed states relative to the segment. Each state can perform some action. The action is usually based on further data input. The input can result in the outputting of some data and/or a transition to a new state.

The content value of the segment is input to the FSA and a tree is built as the FSA traverses the content value. The tree is forwarded to the packager 310. A decoder 316 simply follows the tree to recover the content value. Both the transform process 502 and the decoder 316 have to have access to the FSA either through transmission or access to a FSA Database on either end.

Three further example transforms that the transform process 502 is capable of using are de Bruijn sequences, 3-D graph trees, and intersecting curves in N-dimensional space.

The de Bruijn sequence is a binary sequence in which every possible string can be found. The starting point is sent and then the log$_2$M is extracted from the sequence to reconstruct the message. Since this is a very long sequence and the log$_2$ of the overhead needed for decoding can approach log$_2$ of the original segment, this transform often results in little or no efficiency gain.

Use of a 3-D Graph Tree is similar to the de Bruijn sequence in that a starting point and path are tracked through the 3-D Graph, yielding every possible bit combination. Just as with the de Bruijn sequence, the solution can approach the size of the segment, resulting in little or no efficiency gain.

Thirdly, by representing a segment's content value as a geometrical object in N-dimensional space (where N is smaller than the length of the data segment), formulae representing curves in this space are fit to this object. The curves do not have to intersect since it is possible to define the content value point by the center of gravity of the curves. Also, if needed, deltas from the curve(s) can be used to target the content value point in N-space more effectively.

State Information Selection Techniques

There are multiple techniques to select 604 variable values or other state information of the transform. Generally, although not always, variables for arithmetic transforms are selected using different techniques than for selecting variable values for logical or other transforms. Techniques that are normally used to select variables for arithmetic transforms include the techniques below.

A first selection method is to simply try a randomly generated variable value, and keep trying different variable values until variable values that result in a transform and state information with a desirable compression is found. This can consume considerable time.

Alternatively, all content values resulting from each possible set of variable values (except the remainder) of a given arithmetic transform can be pre-calculated and stored in a database. Then, content values are compared to the database and the appropriate variable values are retrieved. Pre-calculating these content value permutations greatly increases the speed of the transform process 502, but at a cost in terms of storage. By storing only every tenth, hundredth, thousandth, etc. variable value set, the storage requirements can be reduced and still provide the approximate variable values that the transform process 502 should test.

Figure 7:
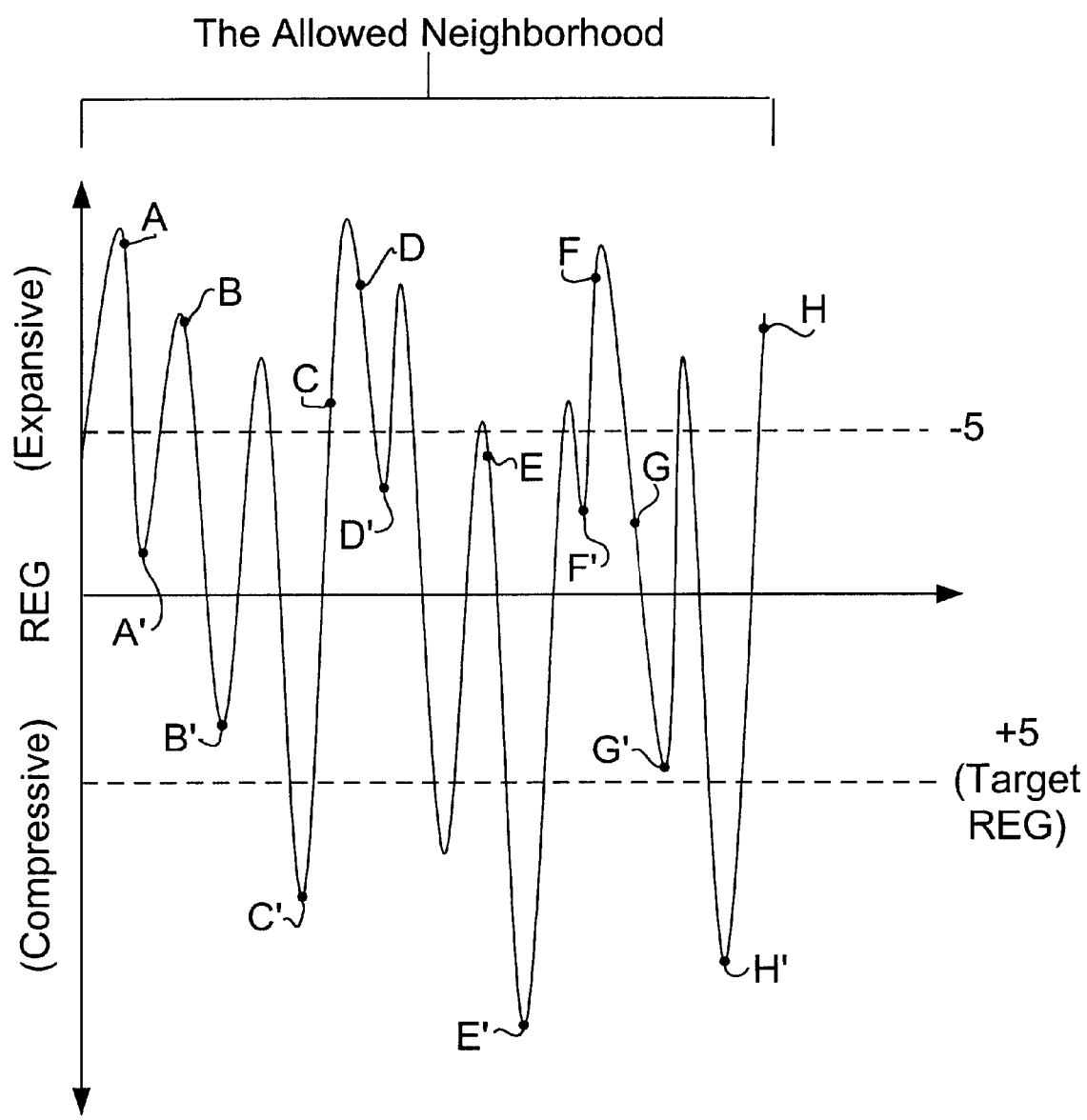
FIG. 7 illustrates finding a set of favorable state information without testing every possible set of state information.

The time spent trying different variable values can be reduced by binding the variable value permutation branching to certain neighborhoods where prior attempts have shown the highest likelihood of successful transform solutions given an application data type characteristics determined by the pre-processor 304. FIG. 7 illustrates finding a set of variable values without testing every possible variable value. Such a method is desirable because testing every possible combination of variable values may take a prohibitively large amount of time or computational cycles.

From previous processing of a particular data type, the control program 306 stores variable values that tend to result in successful compression of the data segment. These successful variable values define an "allowed neighborhood" for subsequent selection of variable values. The allowed neighborhood is a range of variable values. When selecting variable values, the transform process 502 picks starting points within the allowed neighborhood. The transform process 502 picks the starting point randomly, or based on prior successful values. In the example shown in FIG. 7, seven starting points, A, B, C, D, F, G, and H, of n bit-length representations of transform(s), state information, and packet information permutations are picked. Fewer or more starting points are chosen in other embodiments. In the example of FIG. 7, most starting points are actually expansive sets of variable values, which result in a bit-length representation of the content value that is larger than the bit-length of the original segment 406 representation.

The transform process 502 uses an optimization algorithm to iteratively test different sets of variable values as state information. For each starting point, the transform process 502 selects variable values one point to the left and one point to the right of the starting points in the allowed neighborhood (i.e. actually one higher and one lower). The control program 306 compares the bit-length necessary to represent each combination of transform, state information, and packet overhead, and tracks which variable values are represented with a smaller or larger bit-length. The transform process 502 then chooses the set of variable values with the smallest bit-length representation as new starting points. Hence, the variable values selected by the transform process 502 approach the local optima. The transform process 502 repeats the process until it reaches points from which the nearest choices only become less representationally efficient. These points are the local optima, represented by points A', B', C', D', F', G', and H'. The transform process 502 or transform engine 308 then chooses the best point from this group, as discussed above.

Although E' would have been the global optima within the allowed neighborhood, it was never found because starting point E (or any other point close to E') was never examined. This is a case where the global optima is sacrificed for the sake of avoiding an exhaustive test of each and every set of variable values within the allowed neighborhood. Furthermore, although H' is a better set of variable values than C', the process monitor may be set to terminate the process once any combination of transform, state information, and packet overhed is found that meets a target REG. Additionally, it appears from FIG. 7 that it would take fewer processor cycles to get from C to C' than from H to H'.

Specific strategies are appropriate when using partial solutions. As discussed above, for partial solutions the transform process 502 chooses a subset $S \subseteq H$ of the given positive solutions so that its cumulative length obeys (for non-overlapping partial solutions):

$$x = \sum_h [c(h) + l(i(h)) - (j(h) - i(h)]$$

where l(i(h)) is the number of bits necessary to represent i(h). The transform process 502 solves this using the technique called dynamic programming, in particular with one-dimensional dynamic programming. In this technique, a problem that must be solved for a string is first solved for substrings of increased length, with the problem at each string solved by looking at the solutions for its substrings. As with many optimization problems, this becomes a problem of intelligent "branch and bound" strategies. This strategy arrives at a solution, possibly sub-optimal, without an exhaustive search for the global optima.

Figure 8:
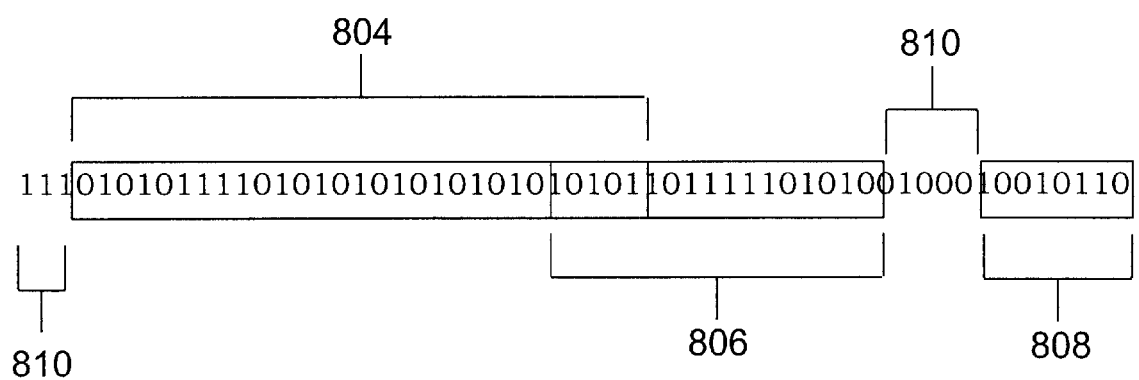
FIG. 8 illustrates partial solutions within a segment.

FIG. 8 illustrates partial solutions within a segment. Partial solutions occur anywhere within the segment. The highest efficiency combinations of transforms and state information are tested up and down the segment in search of best matches using dynamic programming techniques. Where a match occurs, an offset pointer is generated to measure its location relative to the beginning or end of the string or to other partial solutions. Partial solution matches 804, 806, and 808 are generated. Some of the matches overlap each other, seen in matches 804 and 806, slightly reducing the overall efficiency gain. Finally, there are areas where there is no match 810 and the bits are simply sent as raw data.

Offsets are then used to identify where within the segment good matches of transform permutations with content value exist. Representations of offsets (and the associated remainders) become part of the total sum measurement to be compared to the bit-length size of the segment 406 when determining whether compression has been achieved.

The application of combinatorial optimization heuristics can also aid in reducing the time required to find state information that leads to successful compression rates. These heuristics include (but are not limited to):

1. Hill Climbing;
2. "Greedy" Hill Climbing;
3. Tabu Search;
4. Simulated Annealing;
5. Application of Artificial Neural Networks;
6. Application of Boltzman Machines;
7. Application of Evolutionary Algorithms; and
8. Application of Genetic Algorithms/Genetic Programming.

The application of any of these heuristics is likely to result in a bit-length solution that is not the global optima that would result from the measurement of the bit-length for each and every possible variable value set for the transform. However, the solution may be acceptable in terms of the available computational power of the transform engine 308, any time or trial constraints set by the process monitor, and any desired target efficiency gain that reflects application-specific demands.

The heuristic applied affects not only the number of different sets of state information to be tested, calculated, and measured, but also the efficiency of the search strategy within the state information permutation neighborhood(s) targeted by the heuristic. Different data type characteristics lend themselves to the application of different heuristics to target the segment's content value. The transform process 502 determines whether and how to apply combinatorial optimization heuristics based on the information gained by the pre-processor 304 through data type analysis and the information tracked by the control program 306.

Another way to find a solution for a transform is with the use of intelligent agents ("BOTS"). By referencing the results of prior segment transforms, the BOTS process takes advantage of the similar characteristics of groups of segments. Output of the transform engine 308 is analyzed to establish advantageous initial positions for the BOTS. The BOTS are intelligent, independent agents. Effectively, BOTS are points scattered in content value space. As subsequent segments are received, they also represent points in content value space. By attaching a fictitious attractive potential to these points, BOTS move closer to the "center of gravity." The transform engine 308 measures deltas from the BOT to each of the arithmetic transforms previously successfully tested. At a point set by the process monitor (for instance, number of segments or processing time), the information that is sent to the packager 310 is the BOT state information (position and the various deltas) rather than the transforms and their variable values.

Because content value groupings sometimes re-emerge, BOT positions are sampled into a database to be recalled later. For example, the beginning of a video line often may have content values that differ from those at the middle and end of each line. Each subsequent line likely repeats those content value groupings. Therefore, after the first line the transform engine 308 has the BOT positions most suited to the various segments of the video line. During each subsequent video line, the BOTS continue to optimize their positioning and their resulting deltas. As the video scene changes, the BOTS follow the changing video information.

As with arithmetic transforms, there are techniques to efficiently search for efficient representations of content value for logical transforms. Combinatorial optimization is used to efficiently search all possible logical permutations for the representation of content value.

For a DNF transform, selecting the state information involves finding a more compact representation (Boolean expression) of the standard DNF expression equal to the content value. This then provides compression where the compact representation can be reformulated back into standard DNF form, thereby allowing for the retrieval of the original string. As mentioned previously, the standard DNF function of:

$$f(x_1, x_2, x_3) = 1(x_1 \cdot x_2 \cdot x3) + 1(x_1 \cdot x_2 \cdot {\sim} x_3) + 1(x_1 \cdot {\sim} x_2 x_3) + 1(x_1 \cdot {\sim} x \cdot x_3) + 1({\sim} x_1 x_2 {\sim} x_3)$$

which can also be more compactly expressed as:

$$f(x_1, x_2, x_3) = (x_1 \cdot x_2) + (x_1 \cdot \sim x_2 \cdot x_3) + (x_1 \cdot \sim x_2 \cdot \sim x_3) + (\sim x_1 \cdot x_2 \cdot \sim x_3)$$

which can in turn be more compactly expressed as:

$$f(x_1, x_2, x_3) = (x_1 \cdot \sim x_2) + (x_1 \cdot \sim x_2) + (\sim x_1 \cdot x_2 \cdot \sim x_3)$$

In one embodiment, a genetic algorithm is used to select the state information for the reduced expression of the standard DNF expression. The genetic algorithm (GA) uses rules to accomplish the two objectives of finding DNF representations and finding the smallest DNF expressions.

A genetic search algorithm uses several steps:

1. Initialize: Construct an initial population of n potential solutions;
2. Fitness: Evaluate fitness of each population member first by its representational completeness, then by its REG value and sort population by fitness;
3. Selection: Select parent-pairs for mating from the upper, high-representation, high-REG part of the population;
4. Reproduce: Generate offspring by crossover of parent pairs;
5. Mutate: Mutate randomly selected members of the population by shuffling them;
6. Replace: Replace the lower part of the population with offspring and mutated members; and
7. Termination: Repeat steps 2–5 until a stop criterion set by the process monitor is reached.

Further, there are methods to select successful basis strings when using a DNF transform. Standard basis strings can be used to target any content value. However, fewer basis string options yield better results. The first option is data-derived basis strings. By determining the characteristics of the segment from analyzing the segment's data type during pre-processing, basis strings are derived which optimize efficiency gain. Because the basis string(s) must be sent to the decoder 316 so that both the packager 310 and decoder 316 have a record of the strings, a newly derived set should be used for multiple segments to raise the overall efficiency gain.

A second option is a pre-defined basis string database. Where a data type is known, or the application which generated a segment is known, or where the pre-processor 304 is able to derive the data type through analysis 400, the transform process 502 uses a database of basis strings. The control program 306 generates the database of basis strings by storing previous successful basis strings. The decoder 316 also references the database of basis strings. When the database of basis strings is used, only the index reference to the basis string database is included in the packet overhead.

The third option is preprocessing segments for select basis strings. By appropriate preprocessing of permutations of the segment, the transform process 502 selects basis strings that optimize efficiency gain.

Packager

The packager 310 creates a packet that includes all information needed to identify the transform, the state information, plus all other information needed to recalculate the content value of the segment and reconstitute the original binary string. The information identifies whether the packet includes a transform or whether the segment is sent as raw data. The information also identifies which transform(s) were used to encode the content value of the segment and the state information of the transform, including any remainder. Finally, the information states whether and how the segment was mutated. The packager 310 uses known packet coding techniques to pack this data as small as possible into the packets.

A packet preferably consists of the following three components:

1) Packet Overhead which signifies:
   a) A "flag-bit" to signify whether transformed or untransformed data follows;
   b) Bit-length of the segment;
   c) Bit-length of the packet;
   d) The identity of the segment
   e) Segment mutating information (if any);
   f) The identity of any transform(s) used to represent the content value of the segment;
2) Any explicit state information needed by the transform (s), which includes:
   a) Any coefficient(s), variable(s), remainder(s), heuristic-derived information, or other state information used by the transform(s) to target the content value;
   b) Any offsets for partial solution(s);
   c) Any Finite State Machine related information;
   d) Any BOT related information;
3) Any untransformed data.

In some embodiments, precedence, implied, data type and application-driven standards, and levels of implied rules are used to avoid packing all of this data in each packet. Information can be implicitly encoded as well as explicitly encoded. To save space, implicit information is not sent or stored explicitly. For instance, if raw data is sent, it is flagged, and the only additional packet overhead needed is the bit-length of the raw data. Also, if all segments are the same standard bit-length known by the unpackager 314 and decoder 316, the bit-length of the segment is not included in the packet. Optionally, certain data types and certain applications are set up to use standard and implied packet formats, including fixed bit-length, transform(s), variable value lengths, or other standardized information.

For example, a compression system 300 embodiment only uses an exponent factorization transform, $T = a^{b^c}$ or sends raw data. The packets in this compression system 300 embodiment begin with a flag bit, where a "1" indicates that the raw segment is being sent and a "0" indicates that the segment has been transformed. The values of the three variables a, b, and c of different sizes must be written in the packet so that the decoder 316 can read them unambiguously. One way to do this is to precede the three variable values with their sizes, where the sizes are written as m-bit numbers, and to precede those with the value of m, written in 5 bits.

If the size of the binary strings is limited to 1 megabit (1 megabit=$2^{20}$), and only exponent-factorizations where the total size of a, b, and c does not exceed n/2 (n is the number of bits of the binary string) are considered, then each of the three factors a, b, and c is at most 512K (512K=$2^{19}$) bits long, so its size can be expressed in 19 bits. Writing the three sizes on the compressed file as 19-bit numbers increases the file size by 57 bits. Parameter m should express values between 1 and 19, so its size is just 5 bits. The total overhead is 57+5=62 bits, which is negligible compared to a megabit.

Applying the exponent factorization to the 48-bit number 33,232,930,569,601, which is $7^{2^4}$, provides values of a, b, and c of 7, 2, and 4, respectively. Since n/2=3, the maximum size of a, b, and c is three bits, so their sizes 3, 2, and 4 are written as 3-bit numbers (since the largest one is a three bit number), preceded by the number m=3 in 5 bits. Thus, the final 23-bit packet is:

0|m|3|2|3|7|2|4=0|00011|011|010|011|111|10|100

This provides one example of how all overhead coding and necessary information, such as variable values, are packaged by the packager 310 into a packet.

The following is a detailed example of the packager 310 creating a packet from a DNF logical transform. As discussed above, the DNF uses Boolean operators and a set of pre-defined basis strings known to both encoder and decoder:

BS0 AA AA AA AA AA AA AA AA
BS1 CC CC CC CC CC CC CC CC
BS2 F0 F0 F0 F0 F0 F0 F0 F0
BS3 FF 00 FF 00 FF 00 FF 00
BS4 FF FF 00 00 FF FF 00 00
BS5 FF FF FF FF 00 00 00 00

If the segment has a 64-bit content value of $M=7766554433221100_{16}$ a reduced expression of the standard DNF expression that is equivalent to M is:

$$M=7766554433221100_{16}=(((\sim BS5 \cdot BS3 \cdot \sim BS1)$$
$$+(BS5 \cdot \sim BS3 \cdot BS1)+(BS5 \cdot$$
$$BS3 \cdot \sim BS1)+(BS5 \cdot BS3 \cdot BS1)) \cdot$$
$$((\sim BS5 \cdot \sim BS0)+(BS5 \cdot \sim BS0)))+$$
$$(((\sim BS5 \cdot BS4)+(BS5 \cdot BS4)) \sim ((\sim BS1 \cdot BS0)))$$

One possible packet representing the solution is:
100|101010|11100100|1|100001|0101|0|110000|1010|1|000011|0010

The significance of each bit in this packet is detailed in the following table.

binary string, they have the advantages of taking less storage space and being transmitted more quickly than the original binary data.

Unpackager

As previously stated, the unpackager 314 receives the packet if the packet has been transmitted, or retrieves the packet from storage if the packet has been stored. The unpackager 314 interprets the packet overhead instructions, unpacks the packet components and associated information for use by the decoder 316, and unpacks any raw data.

Decoder

The decoder 316 receives the unpackaged information from the unpackager 314 and recalculates the original segment. The decoder 316 applies the state information to the appropriate transform(s) to recalculate the content value of the segment. If the data was mutated, the process is reversed for that given segment to recover the original format of the segment.

If any information about transform(s), mutation(s) or other processes is needed by the decoder 316 but are not stored locally, the decoder 316 requests the information from: 1) the control program 306; 2) a repository of information about transform(s), mutation(s), and other processes; or 3) by reconstructing them from a locally available repository of information about the transform(s), mutation(s), or other processes.

In some embodiments, the decoder 316 looks up the content value(s) in a database of transform content values instead of calculating them.

Reconstitutor

As discussed previously, the reconstitutor 318 receives the segments from the decoder 316 and concatenates the

| Bits | Binary | Value | Description |
| --- | --- | --- | --- |
| 0–2 | 100 | 4 | Number of sub-expressions. |
| 3–8 | 101010 | BS5, BS3, BS1 | Bitmap of Basis strings used in sub-expression 1 |
| 9–16 | 11100100 | (~BS5 · BS3 · ~BS1) + (BS5 · ~BS3 · BS1) + (BS5 · BS3 · ~BS1) + (BS5 · BS3 · BS1) | Variable length field that represents the coefficients of the Disjunctive normal form (DNF) truth table using only the Basis strings designated in the previous field. |
| 17 | 1 | AND (since the AND operator takes precedence over the OR operator) | Boolean Operator between sub-expressions |
| 18–23 | 100001 | BS5, BS0 | Bit map of Basis strings used in sub-expression 2 |
| 24–27 | 0101 | (~BS5 · ~BS0) + (BS5 · ~BS0) | DNF for sub-expression 2 |
| 28 | 0 | OR | Boolean Operator between sub-expressions |
| 29–34 | 110000 | BS5, BS4 | Bit map of Basis strings used in sub-expression 3 |
| 35–38 | 1010 | (~BS5 · BS4) + (BS5 · BS4) | DNF for sub-expression 3 |
| 39 | 1 | AND | Boolean Operator between sub-expressions |
| 40–45 | 000011 | BS1, BS0 | Bit map of Basis strings used in sub-expression 4 |
| 46–49 | 0010 | ~BS1 · BS0 | DNF for sub-expression 4 |

Thus, the packager 310 creates a 50-bit packet that represents the 64-bit content value.

Storage/Transmission

The packets are simply binary data. Therefore, as previously stated, the packets are capable of being stored or transmitted using established storage or transmission methods. Because the packets are smaller than the original input segments in sequence to reconstitute the original binary string. Based on application parameters, this can be done to an entire file or streamed as needed by the application. The reconstitutor 318 then outputs the binary string 320. The binary string 320 output by the reconstitutor 318 is identical to the input binary string. Thus, the compression system 300 provides lossless compression.

We claim:

1. A method of compressing a digital data stream comprising the steps of:
   segmenting the digital data stream into discrete segments;
   evaluating each discrete segment and selecting a transform for each discrete segment wherein said selected transform along with associated state information has a numerical value indicative of the discrete segment;
   generating a code representative of each of said selected transform and associated state information for each of said discrete segments, whereby said generated code and selected state information for each discrete segment represents a numerical value indicative of said discrete segment.

2. The method of claim 1, wherein the transform is a mathematical transform.

3. The method of claim 2, wherein the transform is a logical transform.

4. The method of claim 3, wherein the transform is a disjunctive normal form (DNF) function.

5. The method of claim 4, wherein the DNF function comprises a plurality of basis strings.

6. The method of claim 5, further comprising identifying a data type of the message.

7. The method of claim 6, wherein the plurality of basis strings are retrieved from a database of basis strings based on the data type of the message.

8. The method of claim 5, wherein the plurality of basis strings are in a database of basis strings.

9. The method of claim 4, wherein selecting a set of state information for the transform comprises:
   expressing the message in a standard DNF function; and
   selecting a reduced expression of the standard DNF function.

10. The method of claim 9, wherein selecting the reduced expression of the standard DNF function comprises applying a combinatorial optimization heuristic.

11. The method of claim 10, wherein the combinatorial optimization heuristic is genetic algorithm.

12. The method of claim 3, wherein the transform is a finite state machine.

13. The method of claim 2, wherein the transform is an arithmetic transform.

14. The method of claim 13, wherein the arithmetic transform comprises an arithmetic function with at least one variable.

15. The method of claim 14, wherein selecting the transform and associated state information comprises:
   selecting values for all variables of the arithmetic function;
   determining a numerical value of the function with the selected variable values;
   determining a remainder, the remainder being equal to the difference between the numerical value of the message and the numerical value of the function with the selected variable values; and
   wherein the state information comprises the selected variable values and the remainder.

16. The method of claim 1, wherein selecting the transform and associated state information comprises testing a plurality of sets of state information.

17. The method of claim 16, wherein testing a plurality of sets of state information comprises:
   for each of the plurality of sets of state information, generating a code representing the transform and set of state information;
   evaluating the size of each code; and
   selecting the transform and associated state information having the smallest size code.

18. The method of claim 17, the code further representing packet overhead.

19. The method of claim 1, wherein selecting the transform and associated state information comprises testing a plurality of transforms.

20. The method of claim 19, wherein testing the plurality of transforms comprises:
   for each of the plurality of transforms, testing a plurality of sets of state information associated with the transform, each transform and set of state information having a numerical value equal to the numerical value of the message;
   for each of the plurality of sets of state information, generating a code representing the transform and set of state information;
   determining the size of each code; and
   selecting the transform and associated state information having the smallest size code.

21. The method of claim 20, wherein selecting the transform and associated state information having the smallest size code comprises selecting the transform and associated state information having a code size equal to or less than a target code size.

22. The method of claim 20, further comprising, responsive to period of time elapsing, selecting the transform and associated state information tested having the smallest size code.

23. The method of claim 20, further comprising, responsive to executing a number of computational cycles, selecting the transform and associated state information tested having the smallest size code.

24. The method of claim 1 further comprising applying a mutation to the message prior to selecting the transform and associated state information.

25. The method of claim 24, wherein the code representing the selected transform associated state information further represents packet overhead.

26. The method of claim 25, the packet overhead identifying the applied mutation.

27. The method of claim 24, the mutation is selected from the group consisting of a shuffle, a complement, a shift, a compression method, a scaling method, and an XORing method.

28. The method of claim 1, wherein selecting the transform and associated state information comprises:
   selecting a plurality of partial solution transforms, the partial solution transforms combining to comprise the transform; and
   for each of the plurality of partial solution transforms, selecting state information associated with that partial solution transform, the partial solution transform and state information having a numerical value equal to the numerical value of a portion of the message, the state information associated with each partial solution transform combining to comprise the state information.

29. The method of claim 28, wherein selecting the plurality of partial transforms and associated state information comprising applying dynamic programming.

30. The method of claim 29, wherein selecting the plurality of partial transforms and associated state information comprises applying one-dimensional dynamic programming.

31. The method of claim 1, further comprising identifying a data type of the message.

32. The method of claim 31, wherein identifying the data type of the message comprises comparing the message to a database of messages with known data types.

33. The method of claim 31, wherein identifying the data type of the message comprises identifying an application that generated the message.

34. The method of claim 31, wherein the transform is selected based on the data type of the message.

35. The method of claim 31, wherein the state information is selected based on the data type of the message.

36. The method of claim 31, further comprising applying a mutation to the message based on the data type of the message.

37. The method of claim 31, further comprising:

selecting a transform based on the data type; and applying a mutation to the message, the mutation applied based on the selected transform.

38. The method of claim 1, wherein the code further represents packet overhead.

39. The method of claim 38, the packet overhead comprising a flag signifying that the message has been transformed.

40. The method of claim 38, the packet overhead comprising a bit-length of the message.

41. The method of claim 38, the packet overhead comprising a bit-length of the code.

42. The method of claim 38, the packet overhead comprising an identification of the message.

43. The method of claim 38, the packet overhead comprising an identification of the selected transform.

44. The method of claim 38, the packet overhead comprising information required to interpret the selected state information.

45. The method of claim 1, wherein selecting the transform and associated state information comprises selecting the state information from a precalculated database the precalculated database including a plurality of sets of state information and, for each of the plurality of sets of state information, a corresponding numerical value of the transform and that set of state information.

46. The method of claim 45, wherein selecting the state information from the precalculated database comprises selecting the set of state information in the precalculated database having the corresponding numerical value closest to the numerical value of the message.

47. The method of claim 1, wherein selecting the transform and associated state information comprises:

selecting a first transform and associated state information from a precalculated database, the precalculated database including a plurality of sets of state information associated with the first transform and, for each of the plurality of sets of state information, a corresponding numerical value of the first transform and that set of state information;

determining a remainder, the remainder being equal to the difference between the numerical value of the message and a numerical value of the first transform and associated state information;

selecting a second transform and associated state information from the precalculated database; and wherein the transform and associated state information comprises the first transform and associated state information and the second transform and associated state information.

48. The method of claim 47, wherein selecting the first transform and associated state information from the precalculated database comprises selecting the transform and associated state information in the precalculated database having the corresponding numerical value closes to the numerical value of the message.

49. The method of claim 1, wherein selecting the transform and associated state information comprises:

applying a combinatorial optimization heuristic to determine a best state information, the best state information having the smallest code size representing the transform and that state information; and selecting the best state information.

50. The method of claim 49, wherein the applied combinatorial optimization heuristic is selected from the group consisting of hill climbing, greedy hill climbing, tabu search, simulated annealing, an artificial neural network, a Boltzman machine, an evolutionary algorithm, and a genetic algorithm.

51. The method of claim 1, wherein selecting the transform and associated state information comprises:

applying intelligent agents to determine the best state information, the best state information having the smallest size code representing the transform and that state information, and selecting the best state information.

52. The method of claim 51, wherein the intelligent agents store the transform and associated state information selected for previous messages.

53. The method of claim 1, wherein selecting the transform and associated state information comprises:

selecting a first transform and state information associated with the first transform;

determining a numerical value of the first transform with the associated state information;

determining a remainder, the remainder being equal to the difference between the numerical value of the message and the numerical value of the first transform with the associated state information;

selecting a second transform and associated state information, the second transform and state information having a numerical value equal to the numerical value of the remainder; and wherein the transform and associated state information comprises the first transform and associated state information and the second transform and associated state information.

54. The method of claim 1, wherein the transform is selected from a stored library of transforms.

55. The method of claim 39, wherein the transform is selected from the group consisting of exponential factoring, power series, geometric series, integer series, trigonometric functions, Bessel functions, asymptotic series, disjunctive normal form functions, finite state automata, de Bruijn sequences, 3-D graph trees, N-dimensional space representations, infinite products, continued fractions, Diophantine equations, Mobins functions, algebraic curves, integral transformations, inverse circular (trigonometric functions, spherical trigonometric functions, logarithmic functions, hyperbole functions, orthogonal polynomials, polylogarithms, Legandre functions, elliptic integrals, sequence transformations (z-transform), and Markov chains.

56. The method of claim 1, wherein selecting the transform and associated state information comprises:

retrieving a range of state information from a stored list of prior successful ranges of state information;

iteratively testing different sets of state information within the range of state information using an optimization algorithm;

for each set of state information, generating a code representing the transform and set of state information; and selecting the tested set of state information having the smallest code.

57. The method of claim 1, further comprising:

evaluating the size of the code representing the selected transform and associated state information;

comparing the size of the code to the size of the message; and storing the message if the size of the code is larger than the size of the message.

58. The method of claim 1, further comprising:

evaluating the size of the code representing the selected transform and associated state information;

comparing the size of the code to the size of the message; and transmitting the message if the size of the code is larger than the size of the message.

59. A method as in claim 1 wherein said generated codes and said associated state information values are stored.

60. A method as in claim 1 wherein said generated codes and said associated state information values are transmitted.

* * * * *